United States Patent [19]

Sakakibara

[11] 4,232,303
[45] Nov. 4, 1980

[54] MULTIITEM INDICATING DEVICE

[75] Inventor: Yasuyuki Sakakibara, Okazaki, Japan

[73] Assignee: Nippon Soken, Inc., Nishio, Japan

[21] Appl. No.: 29,906

[22] Filed: Apr. 13, 1979

[30] Foreign Application Priority Data

Apr. 17, 1978 [JP] Japan ................................. 53-50645

[51] Int. Cl.² .............................................. G08B 19/00
[52] U.S. Cl. .............................. 340/366 R; 340/52 F
[58] Field of Search ......................... 340/366 R, 52 F

[56] References Cited

U.S. PATENT DOCUMENTS 3,925,752  12/1975  Jensen ................................ 340/52 F Primary Examiner—Harold I. Pitts
Attorney, Agent, or Firm—Cushman, Darby & Cushman

[57] ABSTRACT

A multiitem indicating device for indicating a title of a desired item, its units and a detected electrical value corresponding to the desired item comprises a pair of drums around which a plurality of titles and their units are indicated respectively, and which are coaxially connected by a connecting shaft so as to be rotated integrally about an axis thereof. An angular position detecting means includes a code plate and a code sensor for detecting an angular position of the two drums and producing electric signals corresponding to said angular position and a figure indicator disposed in a groove surrounded by the two drums and the connecting shaft. Since the title and the detected value and the unit which correspond to the title can be detected on the same straight line on the same plane, the obtained data can be easily and precisely observed.

5 Claims, 4 Drawing Figures

MULTIITEM INDICATING DEVICE

Japanese Utility Model Application No. 50645/1978, filed Apr. 17, 1978, and as to which priority is claimed, is hereby incorporated by reference.

BACKGROUND

The present invention relates to a multiitem indicating device for indicating a plurality of items to be detected and their units and also indicating the detected value corresponding to the desired item electrically in figures.

The present invention aims to make the observation easy and make the device compact.

A conventional device of this type such as shown in FIG. 1 has a construction such that titles of each item such as "Room Temperature" are arranged in line in one side of a panel 1, corresponding units are arranged in line in the other side thereof and a figure indicator 2 is disposed in the central portion thereof. By selectively indicating the desired item, the title, the figures and the unit corresponding to the item are indicated on the panel 1.

However, in such a device, it is difficult to observe the indicated data immediately since the desired title, the figure and the unit are not positioned on the same straight line. Also, when the number of items is increased, it is necessary to make the area of the panel large so that a large space for installing the device becomes necessary. Further, since the indication switching means of titles and units are increased and the wiring to the indicating means becomes complicated, the reliability of the device becomes lower.

Accordingly, an object of the present invention is to provide an improved multiitem indicating device for indicating a title of a desired item, its unit and a detected electrical value corresponding to the desired item, the device having a compact construction.

Another object of the present invention is to provide a multiitem indicating device by which a desired title, its unit and the detected value can be observed easily and precisely.

Still another object of the present invention is to provide a practical multiitem indicating device which can be installed in a limited space such as the interior of an automobile.

DESCRIPTION OF THE DRAWINGS

Other objects and advantages of the invention will become apparent from the following description of embodiments with reference to the accompanying drawings wherein.

DETAILED DESCRIPTION

According to the present invention, a pair of drums for indicating titles and their units respectively are coaxially connected by a connecting shaft of smaller diameter so as to be rotated integrally about an axis thereof. Each title and the unit corresponding to the title are placed on the same straight line along the axial line. An angular position detecting means is provided on the connecting shaft and a figure indicator is disposed in a groove formed between the two drums and the connecting shaft. With this construction, the title, figures and the unit corresponding to the title can be easily observed on the same straight line. Even if the number of the items is large, the device can be made very compact.

Hereinafter, an embodiment of the present invention will be explained with reference to the drawings.

Figure 1:
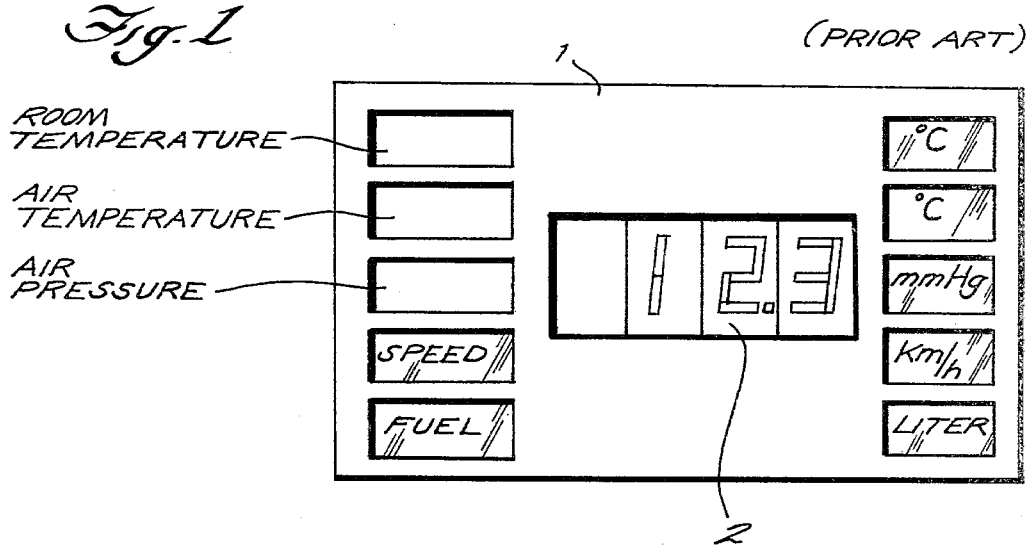
FIG. 1 is a front view of a conventional multiitem indicating device.
Figure 2:
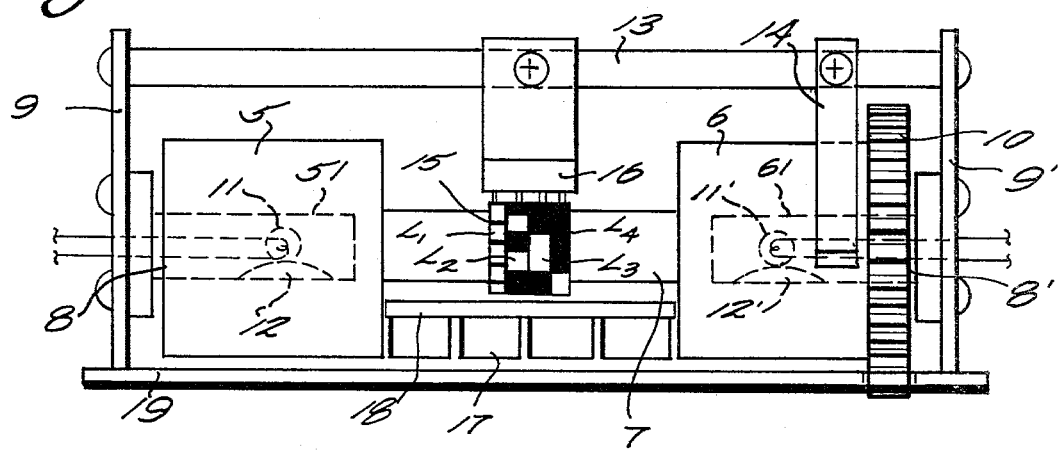
FIG. 2 is a plan view of an embodiment of the multiitem indicating device of the present invention.
Figure 3:
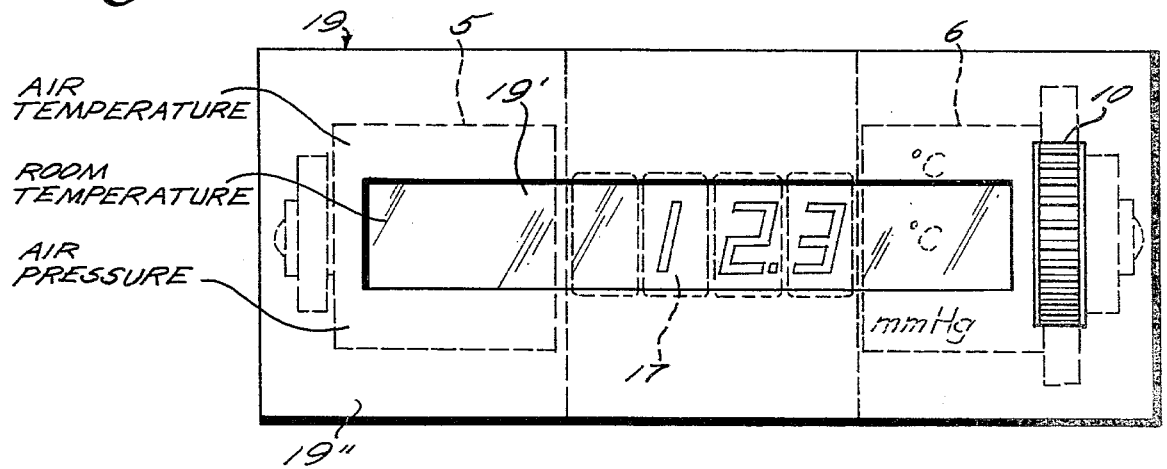
FIG. 3 is a front view of an embodiment of the multiitem indicating device of the present invention.

In FIGS. 2 and 3, reference numeral 5 designates a column shaped drum made of translucent material such as resin, which is provided with a bottomed bearing hole 51 in the axis portion thereof. Around the outer periphery of the drum, desired titles such as "Room Temperature", "Air Pressure" and "Air Temperature" are suitably indicated, being formed for example by a non-electrolytic plating method or the like. Numeral 6 designates another drum having the same diameter as that of the drum 5, which is made of the same material as that of the drum 5. The drum 6 is provided with a bottomed bearing hole 61 in the axial portion thereof. And around the outer periphery of the drum 6, units such as "°C.", "mmHg", and "°C." corresponding to each of the above described titles are suitably indicated. The drums 5 and 6 are coaxially connected by a column shaped connecting shaft 7 having a smaller diameter than that of the drums 5 and 6. Each title and each unit corresponding to the title are placed on the same straight line in the lateral direction along the axis of the drums.

In the bearing holes 51 and 61 of the drums 5 and 6, cylindrical hollow supporting shafts 8 and 8' are slidably inserted. A flange portion of each shaft is fixed to a supporting plate 9 or 9'.

On the outer periphery of the drum 6, a rotary member 10 on which knurling is notched is provided. By rotating the rotary member, the drums 5 and 6 which are connected by the connecting shaft 7 are rotated integrally. Two illuminating devices 11 and 11' such as electric lamps are installed within the supporting shafts 8 and 8' respectively and two illuminating ports 12 and 12' are provided in each of supporting shafts so as to be opposed to the illuminating devices. One end of a biasing member 14 such as a leaf spring is fixed to a supporting plate 13 which is secured between the end portions of the supporting plates 9 and 9'. In the other end thereof, a convex portion is formed so as to be engaged with a plurality of concave portions (not shown) formed on the outer periphery of the drum 6 in order to keep the drum 6 at a predetermined position.

A cylindrical code plate 15 is provided on the connecting shaft 7 coaxially for detecting an angular position of the drums and is contacted with brushes of a code sensor 16, of which one end is supported by the supporting plate 13. A figure indicator 17 is provided in a groove surrounded by the drums 5 and 6 and the connecting shaft 7 for indicating the figures. The figure indicator 17 is fixed to a printed circuit board 18 which is provided along the connecting shaft 7 and on which printed circuits of the figure indicator 17 are formed.

The outer periphery of the code plate 15 as shown in FIG. 2 is formed from conductive material or non-conductive material. The portions made from the conductive material are painted black in FIG. 2. The other white portions indicate non-conductive material. The first line $L_1$ formed on the code plate 15 is a reference code which shows the position of each code. The second, third and fourth line $L_2$, $L_3$ and $L_4$ are three digits constituting binary codes, each of which corresponds to each title indicated in the drum 5. The code sensor 16 is provided with four brushes for the code lines $L_1$, $L_2$, $L_3$ and $L_4$ of the code plate 15.

Figure 4:
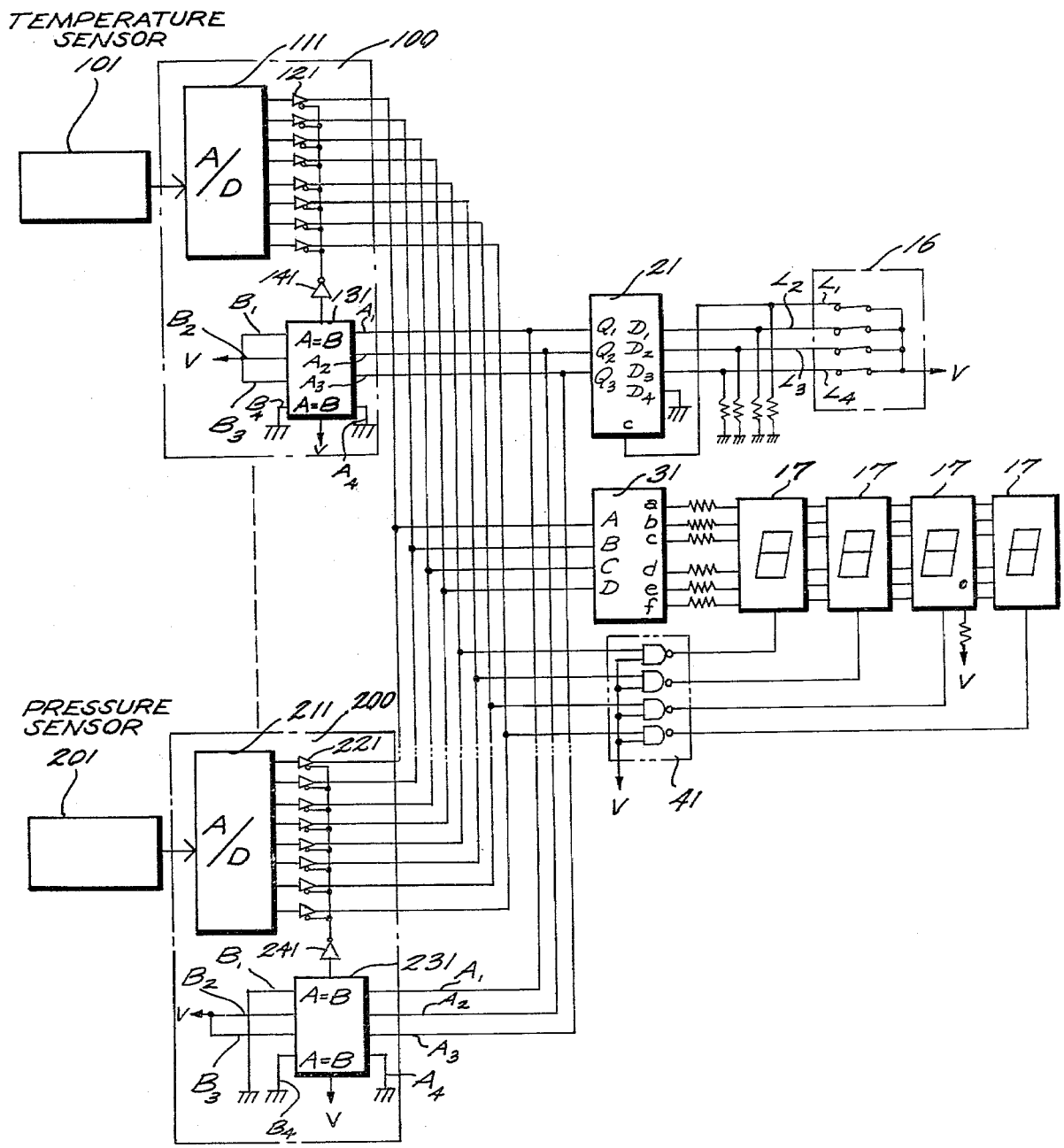
FIG. 4 is an electric circuit diagram from a code sensor 16 to a figure indicator 17 of the multiitem indicating device of the present invention.

When the title to be indicated is selected by the operation of the rotary member 10, a binary code signal corresponding to the title is produced on the code plate 15 by means of the code sensor 16 and the binary code signal is supplied to an electric circuit as shown in FIG. 4. As a result, a desired title, figures and unit corresponding to the title are obtained.

Hereinafter, the operation of the electric circuit as described above will be explained with reference to FIG. 4.

When the first brush of the code sensor 16 is contacted with the conductive material of the first line $L_1$ on the code plate 15, an electric signal of high level ("1") is applied to a latch circuit 21. In this stage, if the second, third and fourth brushes are also contacted with the conductive material of the second, third and fourth lines, electric signals "1" are applied to input terminals $D_1$, $D_2$, and $D_3$ of the latch circuit 21 and memorized therein. Each of the memorized signals of three digits is applied to each of input terminals $A_1$, $A_2$ and $A_3$ of a digital comparator 131 of a select circuit 100 from each of output terminals $a_1$, $a_2$, and $a_3$ of the latch circuit 21.

The select circuit 100 is connected, for example, to a temperature sensor 101 which detects a room temperature. An A/D converter 111 converts analog signals supplied from the temperature sensor 101 into digital signals. A constant voltage V ("1") is always applied to other input terminals $B_1$, $B_2$ and $B_3$ of the digital comparator 131. When the input voltages at the terminals $A_1$, $A_2$, and $A_3$ are equal to those at the other terminals $B_1$, $B_2$ and $B_3$, a "1" signal is applied to an inverter 141 from the digital comparator 131. The inverter 141 inverts the signal from the digital comparator 131 to apply a "0" signal to each of the three-state buffer group 121. Then, the digital signals converted in the A/D converter 111 which show, for example, a room temperature are applied to a decoder 31 and a driver 41 through the buffer group 121. As a result, a room temperature is indicated by the figure indicator 17.

At this time, in another select circuit, for example a select circuit 200 which is connected to a pressure sensor 201 which detects air pressure, a "0" signal, "1" signal, and "1" signal are previously applied to input terminals $B_1$, $B_2$ and $B_3$, respectively. Therefore, even if a "1" signal, "1" signal and "1" signal are applied to another input terminals $A_1$, $A_2$ and $A_3$ respectively from the latch circuit 21, the conditions of the two input signals do not coincide with each other. Therefore, the digital comparator 231 generates a "0" signal and the inverter 241 applies a "1" signal to the three-state buffer group 221.

Even though analog signals indicating the pressure detected by the pressure sensor 201 are converted into digital signals by the A/D converter 211, the three-state buffer group 221 to which a "1" signal is applied, prevents the digital signals from being applied to the decoder 31 and the driver 41.

After the indication of the room temperature is finished as described above, if the rotary member 10 is operated to make brushes corresponding to the first, second, third and fourth line contact with the conductive material, non-conductive material, conductive material and conductive material respectively, a "0" signal, "1" signal and "1" signal are generated in the second, third, and fourth brushes of the code sensor 16, respectively, and memorized by the latch circuit 21 in response to a "1" signal from the first line contact. These signals ae applied to the input terminals $A_1$, $A_2$ and $A_3$ of the digital comparator 231 of the select circuit 200. At this time, the digital comparator 231 detects the coincidence of each of the input conditions of input voltages of $A_1$, $A_2$ and $A_3$ with that of $B_1$, $B_2$, and $B_3$ to enable the digital signals of the A/D converter 211 to be applied to the decoder 31 and the driver 41 through the buffer group 221.

In this case, in the other select circuit, for example, select circuit 100, two input voltages of the digital comparator 131 do not coincide with each other, so that the digital signals generated in the A/D converter 111 are prevented from being applied to the decoder 31 and the driver 41 through the buffer group 121. Therefore, only the air pressure which is detected by the pressure sensor 201 is indicated on the figure indicator 17. In such a manner as described above, if one item is selected and the title and unit are indicated in the figure indicator, figures showing the detected value corresponding only to the selected item are electrically indicated.

The indicating faces of the two drums 5 and 6 and that of the figure indicator 17 are positioned on almost the same plane. In front of the two drums 5 and 6 and the figure indicator 17, a panel 19 of a resin plate is provided. One portion thereof is made transparent and the other portion thereof is made opaque by a black ink-printing or the like in order to show only the obtained data clearly. Both ends of the panel are fixed to the supporting plates 9 and 9'.

The titles and the units can be indicated around the surface of the drums 5 and 6 by various methods as follows. According to one method, the drum is plated with metal and then only necessary portions corresponding to the titles and the units are removed by etching or the like. In addition, there are methods of printing the titles and units on the surface of the drums directly and of winding a film in which the titles and the units are indicated, around the drums.

The changing operation of the title and the units can also be performed by mechanically rotating the drums by motors in place of the above-mentioned rotary member on which knurling is notched. And the connecting shaft 7 can be formed integrally with or separately from the drums 5 and 6, if the drums 5 and 6 and the connecting shaft 7 are integrally rotated. Also, the angular position of two drums can be detected by photoelectric tubes in place of brushes of the code sensor.

According to the device of the present invention, when the rotation of the drums 5 and 6 is stopped so that the desired title such as "Room Temperature" may be observed through the transparent portion of the panel 19, the unit "°C." corresponding to the desired title can also be observed therethrough since the two drums are rotated integrally. Concurrently, the figures corresponding to the room temperature are then indicated in the figure indicator 17 and observed through the transparent portion of the panel 19.

In the device of the present invention, titles and the units corresponding to each title are indicated on the outer peripheries of the two drums so that a set of a title and the units corresponding thereto may be oppositely positioned along an axis of the connecting shaft 7, with a figure indicator provided in a concave portion between the two drums.

Therefore, the title, the figures and the units are indicated on the same plane and on the same straight line so that the obtained data can be easily and precisely observed. Since the titles and units are indicated on the drums, the surface area of the panel need not be widened compared with a conventional device, even if the number of titles is increased. Furthermore, since the figure indicator is provided in the concave portion between two drums, the device can be made extremely compact. At the same time, since the surface area of the panel can be decreased, the wiring into the figure indicator can be made simple. Further, as shown in the above-described embodiment, by disposing the illuminating means within each supporting shaft of the two drums, the indicated data is illuminated uniformly and can be observed clearly even in a location without additional light.

The indicating device of the present invention, having the above-mentioned various merits, is very effective as an indicating device which is installed in a limited space, for example, within the interior of an automobile.

Having now fully described the invention, it will be apparent to one of ordinary skill in the art that many changes and modifications can be made thereto without departing from the spirit or scope of the invention as set forth herein.

What is claimed is:

1. A multiitem indicating device for indicating a title of a desired item out of a plurality of items, the indication units and the electrically detected value corresponding to the desired item comprising:

a pair of drums coaxially connected by a connecting shaft so as to be rotated integrally about an axis thereof;

a plurality of titles and corresponding indication units being indicated around the surfaces of said pair of drums, respectively, so as to be opposed to each other along an axis of said pair of drums;

an angular position detecting means for detecting an angular position of said pair of drums and producing electric signals corresponding to said angular position;

a switching means for selecting a detected value out of a plurality of detected values in accordance with said electric signals produced by said angular position detecting means; and a figure indicator provided in a groove surrounded by said pair of drums and said connecting shaft, and electrically connected to said switching means for indicating said selected detected value.

2. A multiitem indicating device according to claim 1, further comprising an illuminating device which is provided within said pair of drums.

3. A multiitem indicating device according to claim 1, further comprising a rotary member on which knurling is notched and which is provided in one of said pair of drums.

4. A multiitem indicating device according to claim 1, wherein said angular position detecting means comprises:

a cylindrical code plate having a predetermined code composed of conductive material and nonconductive material at a predetermined angular position thereof corresponding to each of a plurality of items, which is provided in said connecting shaft coaxially and rotated integrally therewith; and a code sensor for detecting said predetermined code of said code plate and producing code signals corresponding to each of a plurality of items.

5. A multiitem indicating device according to claim 1, wherein said switching means comprises select circuits corresponding to each the plurality of items.

* * * * *